United States Patent [19]

Gassmann

[11] 3,961,262

[45] June 1, 1976

[54] FM RECEIVER AND DEMODULATION CIRCUIT

[75] Inventor: Gerhard-Günter Gassmann, Berkheim, Germany

[73] Assignee: International Standard Electric Corporation, New York, N.Y.

[22] Filed: Nov. 15, 1974

[21] Appl. No.: 524,097

[30] Foreign Application Priority Data
Nov. 22, 1973 Germany.............................. 2358288

[52] U.S. Cl................................ 325/345; 325/433; 329/50
[51] Int. Cl.²......................................... H04B 1/00
[58] Field of Search.......... 178/23; 325/60, 344–349, 325/351, 432, 433, 437, 444, 419; 329/50, 100, 118, 122, 124

[56] References Cited
UNITED STATES PATENTS

| | | | |
|---|---|---|---|
| 2,997,577 | 8/1961 | Kaminski et al...................... | 329/50 |
| 3,418,578 | 12/1968 | Bose .................................. | 325/346 |
| 3,501,691 | 3/1970 | Ernst................................... | 329/50 |
| 3,806,815 | 4/1974 | Simon................................. | 329/122 |
| 3,831,097 | 8/1974 | Neuf.................................. | 325/437 |

*Primary Examiner*—George H. Libman
*Attorney, Agent, or Firm*—John T. O'Halloran; Menotti J. Lombardi, Jr.; Peter Van Der Sluys

[57] ABSTRACT

An FM receiver has a first pair of signal mixers for receiving an RF signal and a local oscillator for providing a signal to said mixers at a frequency near the center frequency of the received signal. A phase shifter shifts the phase of the local oscillator signal to one mixer by 90°. The outputs of the first pair of mixers are connected to low pass filters having cut-off frequencies equal to approximately one-half the bandwidth of the received signals. A second pair of signal mixers receive the filtered signals and an oscillator signal at a frequency equal to at least twice the cut-off frequency of the low pass filters. The oscillator signal to one of the mixers is phase shifted 90°. The outputs of said second pair of mixers are added together, amplified, limited and thereafter demodulated to provide an audio signal. Automatic frequency control is also provided for the local oscillator.

7 Claims, 8 Drawing Figures

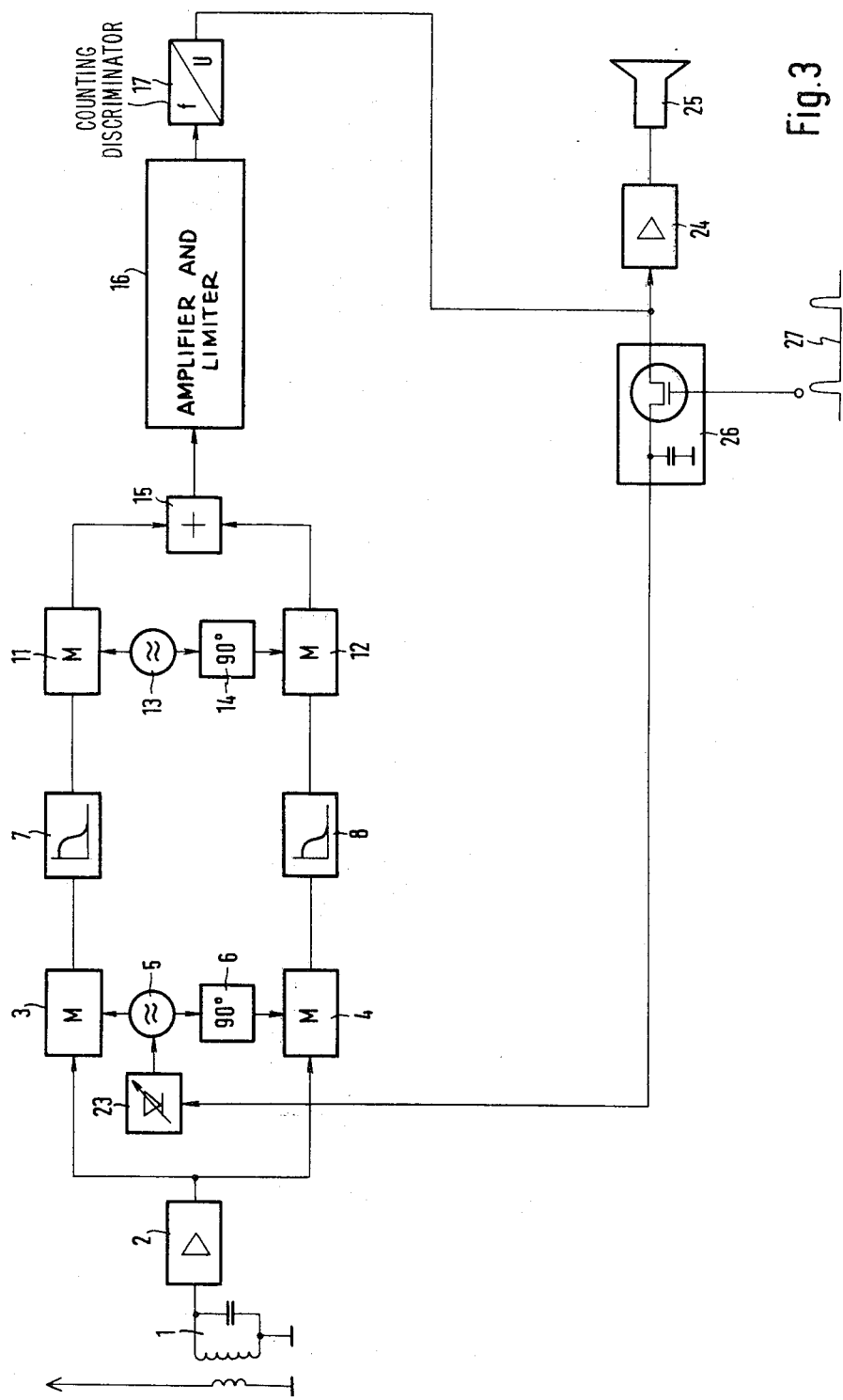

3,961,262

FM RECEIVER AND DEMODULATION CIRCUIT

BACKGROUND OF THE INVENTION

1. Field of the Invention

The present invention relates to a receiver for RF signals, and more particularly to a receiver for frequency-modulated signals.

2. Description of the Prior Art

An FM-receiver is known, e.g., "radio mentor electronic" 32 (1966) No. 6, in which a very low intermediate frequency of about 120 to 180 kHz is generated from the received signal by means of a mixer and a local oscillator; this low-frequency IF signal is selected with RC filters and amplified and then applied to a counting discriminator for FM detection. This known principle suffers from the disadvantage that the signals of an adjacent FM transmitter appear as image frequencies if the oscillator frequency lies between these two transmitter frequencies. The principle has another disadvantage in that, during tuning, each transmitter appears twice, i.e., if the oscillator frequency lies about 150 kHz above and below the transmitter center frequency.

Quite independently of FM receiver engineering, a system of single sideband amplitude modulation is known, "Funkschau" 1972, No. 14, p. 485, which is referred to in the literature as the "third method." In that method, for receiving the sideband, the local oscillator is not tuned to the transmitter's carrier frequency but to the center of the single sideband to be received. The received signal and the oscillator signal are fed to two separate mixers, with either the received signal or the oscillator signal being fed to one mixer with a 90° phase shift in relation to the other mixer. The low-frequency signals obtained in this way by down-conversion are separated, with one lowpass filter each, from adjacent frequencies, e.g., also from the adjacent sideband not to be received, and the carrier is then added again in a low-frequency modulator. These two signals are thus shifted in the low-frequency range in such a manner that, through the additive mixing, the audio signal demodulated by multiplicative mixing in the low-frequency modulator appears with a superposed inverted audio signal. These two quadrature signals are fed to an adding circuit where the audio signals add together, while the inverted audio signals substract and cancel. This "third method," which is used with amplitude modulation, places extremely stringent requirements on the accuracy of the 90° phase shifts and on the symmetry of the addition. Errors of as little as 1% result in the signal-to-noise ratio being reduced to quite a disturbing value (40 dB signal-to-noise ratio). This interference is due to the fact that the signals appearing behind the first mixers and selected in the low-pass filter are frequency-shifted audio signals and that separation from the interfering inverted signal is possible only by means of a bridge circuit (addition or subtraction). In an improvement of this "third method," transmitters with carrier not suppressed are detected by replacing each of the last low-frequency modulators with a full-wave rectifier.

For the reception of telegraph transmitters using frequency-shift keying it is also known to split the output voltages behind the second mixers once again into a direct signal and a signal in phase quadrature and to add the quadrature signal of one mixer to that signal of the other mixer which has not been shifted in phase. This gives two complementary digital signals which are alternately in the 0 or 1 state when the transmitter frequency is above or below its center frequency. This principle is applicable exclusively to digital signals, i.e., telegraph signals, because the criterion evaluated is only whether the received frequency lies above or below a center frequency to which the receiver is tuned. It cannot be used to form intermediate values as are necessary for the transmission of analog signals.

SUMMARY OF THE INVENTION

The invention is characterized in that for the reception of frequency-modulated signals the cutoff frequency of the low-pass filters is chosen so that the passed signal corresponds approximately to one-half the bandwidth of the received FM signal, that the signals appearing at the outputs of the low-pass filters are fed to two separate mixers with carrier suppression which are controlled by an oscillator oscillating at least twice the cutoff frequency of the low-pass filters and have a relative phase shift of 90°, and that the output signals of the mixers are added together, amplified and limited, and demodulated in a frequency discriminator.

In an improvement, the oscillator frequency at which the two first mixers are operated varies from the center frequency of the received RF signal by about 10 kHz. Advantageously, use is made of an automatic frequency control whose afc characteristic is chosen to have an unstable range (range of inverted slope of the characteristic) within approximately ± 10 kHz of the center frequency of the received RF signal.

It is the object of the present invention to provide a receiver for frequency-modulated RF signals which is easily integratable, allows the use of simple RC filters for selection, and permits relatively wide tolerances.

The foregoing and other objectives and advantages of the present invention will become more apparent from the following description and the accompanying drawings wherein one embodiment of the present invention is described.

BRIEF DESCRIPTION OF THE DRAWINGS

FIG. 3 is a block diagram of a second embodiment of the invention.

DESCRIPTION OF THE PREFERRED EMBODIMENT

Figure 1:
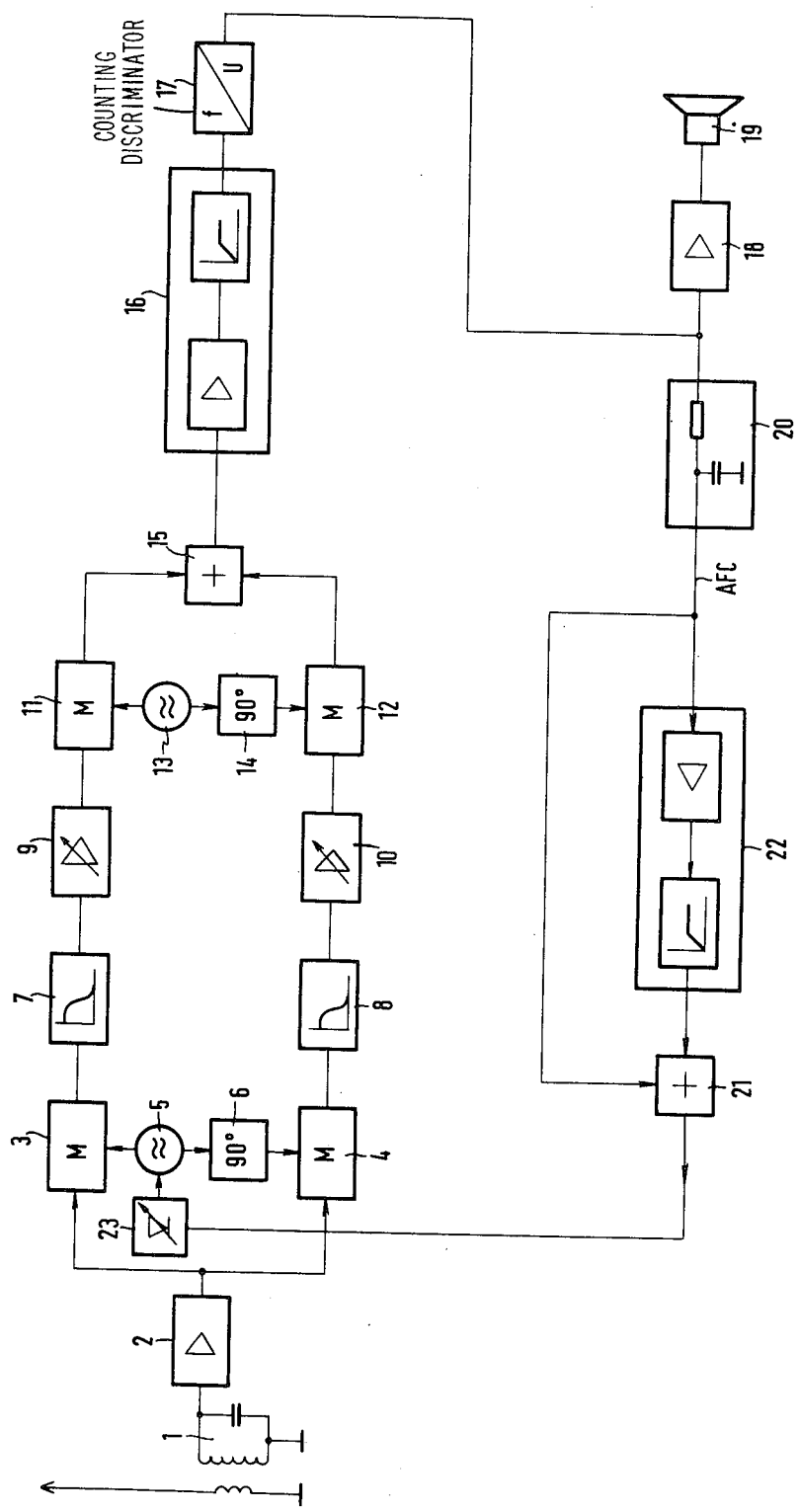
FIG. 1 is a block diagram showing a first embodiment of the invention.

FIG. 1 shows a receiver according to the invention. The antenna signal passes through a conventional preselection, e.g., a tunable resonant circuit 1. This preselection is only designed to make the receiver more immune to cross modulation. If this requirement is not imposed, the preselection may be dispensed with. Its function is not to suppress image frequencies as is the case with conventional receivers. The signal then passes through a circuit 2 which has a low transmission loss from the antenna to the receiver and a high transmission loss from the receiver to the antenna to keep the oscillator's spurious radiation low. The received signal and a voltage coming from a first local oscillator 5 are applied to two separate mixers 3 and 4, with either the received signal or the oscillator signal which is fed to one mixer 4 being shifted in phase 90° with respect to the signal fed to the other mixer 3 by means of a phase shifter 6. Preferably, the oscillator signal is phase shifted rather than the received signal. The oscillator frequency is tuned nearly to the center frequency of the received FM signal. The two first mixers 3 and 4 provide a "zero IF signal," which has a "folded spectrum." The latter term is to express the fact that physical frequencies can never assume negative values, while purely mathematically a distinction is made between negative and positive values. For example, if the received signal has a frequency deviation of ±75 kHz, i.e., a variation of 150 kHz, the zero IF signal, because of the "folding," has a frequency deviation and a variation of only 75 kHz. The two zero IF signals appearing behind the mixers 3 and 4 have a relative phase shift of 90°. They each pass through a low-pass filter 7, 8 which has a bandwidth corresponding approximately to one-half the signal bandwidth. With such simple low-pass filters 7 and 8 high adjacent-channel selectivity can be achieved. Each of these low-pass filters is followed by a non-limiting amplifier 9, 10 which are needed only if the received field strength of the transmitter is so low that amplification is required because of the signal-to-noise ratio; otherwise, the amplifiers 9 and 10 may be omitted. To insure that these amplfiers 9 and 10 never limit the signal, they are advantageously provided with a well-known gain control. Limitation must still be avoided at this point because the zero IF, for certain periods of time, assumes frequencies which are lower than the audio frequency modulated on it, i.e., that the modulation content has several oscillations within one cycle of the zero IF. This information then manifests itself in a departure from the sinusoidal shape.

It would be suppressed at least partly if the zero IF were limited. The two amplifiers 9 and 10 are followed by second multiplicative mixers 11 and 12, respectively, where the two zero IF signals are again converted to a higher frequency with the aid of a second oscillator 13. The frequency of this second oscillator 13 must correspond to at least twice the value of the cutoff frequency of the low-pass filters 7 and 8. The voltage of this second oscillator 13 is fed to one of the two mixers 11 directly and to the other mixer 12 via a 90° phase shifter 14. Both mixers 11 must be designed so that the mixing process is effected with carrier suppression, this being well-known in the art. In an adding stage 15, the output voltages of the two mixers 11 and 12 are added into a single signal which passes through a limiting amplifier 16 and is then demodulated in a frequency discriminator 17. Advantageously, the frequency discriminator is well-known counting discriminator. The audio signal leaving the frequency discriminator 17 is amplified as usual in a low-frequency amplifier 18 and fed to a loudspeaker 19.

For obtaining an afc voltage, the discriminator output voltage is freed, in known manner, from ac voltage components by means of a control-voltage filter 20. If the receiver according to the invention is designed as a sound receiver, the afc voltage is particularly advantageously chosen so that tuning of the first local oscillator 5 to the exact value of the center frequency is not possible but can approximate to this center frequency only to within ± 10 kHz. In the absence of modulation, i.e., with quiescent carrier of the received signal, this measure prevents the generation of an audible difference tone which corresponds to twice the value of the distance between the frequency of the transmitter's quiescent carrier and the frequency of the first local oscillator and is due to unavoidable variations of the 90° shifts and to variations in the symmetry of the addition. In such a receiver, such an interference would be reduced considerably, e.g., 30 to 40 dB, by the limitation, but would remain audible because of the high sensitivity of the ear. According to the invention, however, if the variation of 10 kHz is used, this interferring tone has a frequency of about 20 kHz and thus lies safely outside the audible range. To this end, the filtered control voltage is applied to an adding circuit 21. It is also applied to an amplifying, limiting inverter stage 22. The output voltage of the inverter stage 22 is also applied to the adding stage 21. In the inverter stage 22 amplification by about the factor 2 takes place. At the same time, the inverter stage 22 performs a limitation such that the output voltage has upper and lower limit values and thus corresponds to the discriminator voltage in case of a variation of the oscillator frequency of ± 10 kHz from the center frequency of the received signal. The sum AFC voltage obtained in the adding circuit 21 is used to control the frequency of the first local oscillator 5 in known manner, e.g., with the aid of a varactor 23.

Figure 2A:
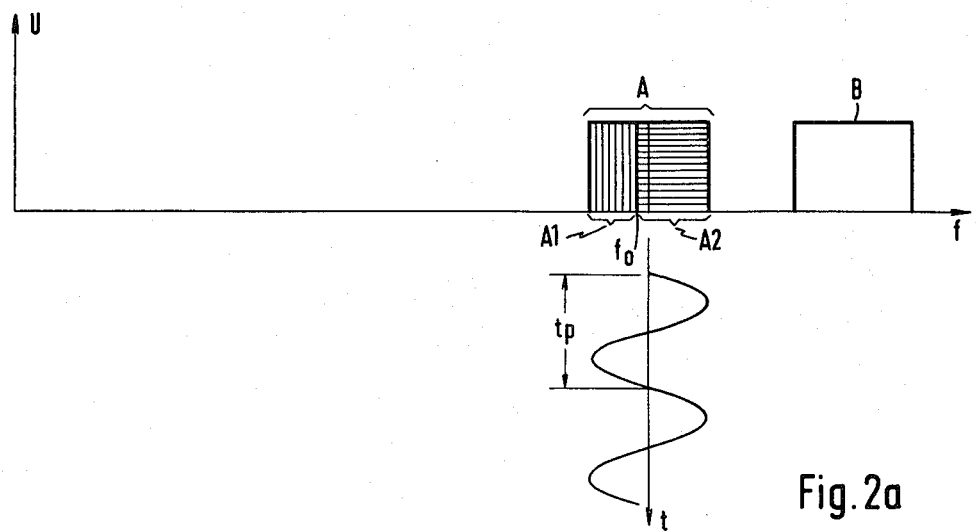
FIGS. 2a–d are explanatory diagrams.

In FIG. 2a, A is the frequency range which the transmitter signal to be received assumes as a result of its frequency modulation. The frequency range of the adjacent transmitter is indicated at B. Below the range A of this FIG. 2a, the time response of the frequency modulation is shown by a sinusoidal oscillation with maximum frequency deviation. (In the case of higher modulation frequencies the frequency range A expands symmetrically to both sides according to the Bessel functions.)

The period is $t_p = 2\pi/\omega$, where $\omega$ is the instantaneous value of the audio frequency, and $f_0$ is the frequency to which the first local oscillator 5 is tuned. As mentioned above, this frequency lies about 10 kHz beside the center frequency, whereby the transmitter signal is divided into two different partial frequency ranges A1 and A2.

Figure 2B:
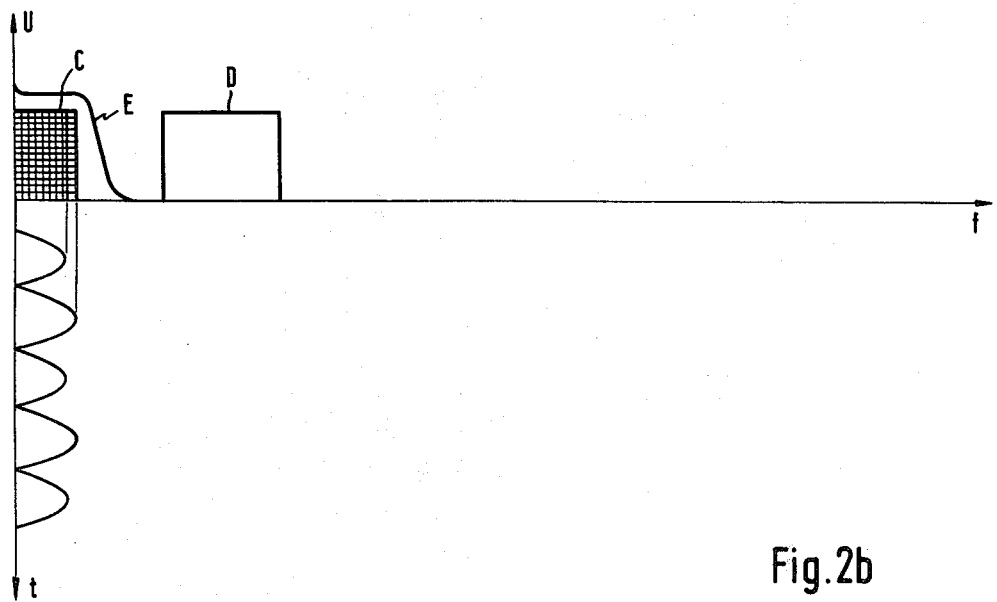

The received signal's frequency range below $f_0$ is designated A1 in FIG. 2a, while the frequency range above $f_0$ is designated A2. The frequency range B, shifted by 300 kHz, for example, is the range of an assumed adjacent transmitter. By down-conversion, the IF signals shown in FIG. 2b are obtained, namely the received signal's zero IF signal C, which is reflected with respect to the zero axis and thus is "folded" in the frequency spectrum about the line $f_0$, and the IF frequency D of the assumed adjacent transmitter. Below the block C the time response of the zero IF is shown again.

It is assumed that the frequency deviation $\Delta\omega$ of the received signal is 75 kHz, while the zero IF signal, in case of the assumed detuning of the oscillator by 10 kHz with respect to the transmitter's center frequency, sweeps a frequency range of only 85 kHz. To separate this zero IF from the intermediate frequency D of the adjacent transmitter B, a low-pass filter is used which is indicated by the passband characteristic E. The amplified zero IF signal is converted to a higher frequency with the aid of the second mixers 11 and 12 (FIG. 1). $f_2$ is the frequency of the second local oscillator 13. In each of the two second mixers 11 and 12 signal frequencies F are produced which have equal inverted-frequency contents G. By addition of the mixed signals the inverted frequencies G are largely suppressed (FIG. 2c).

In contrast to the conditions in the receivers operating by the "third method" with single-sideband-amplitude modulation, in the present case no exacting requirements need be placed on both the 90° phase shifts of the two oscillators and the addition as far as tolerances are concerned. It is only necessary to lower the undesired side frequency in relation to the desired side frequency to such an extent that the following limiter can be clearly activated. It is known from the FM technique that interferring frequencies can be very largely suppressed by limitation if they have an amplitude smaller than that of the mains frequency.

Figure 2C:
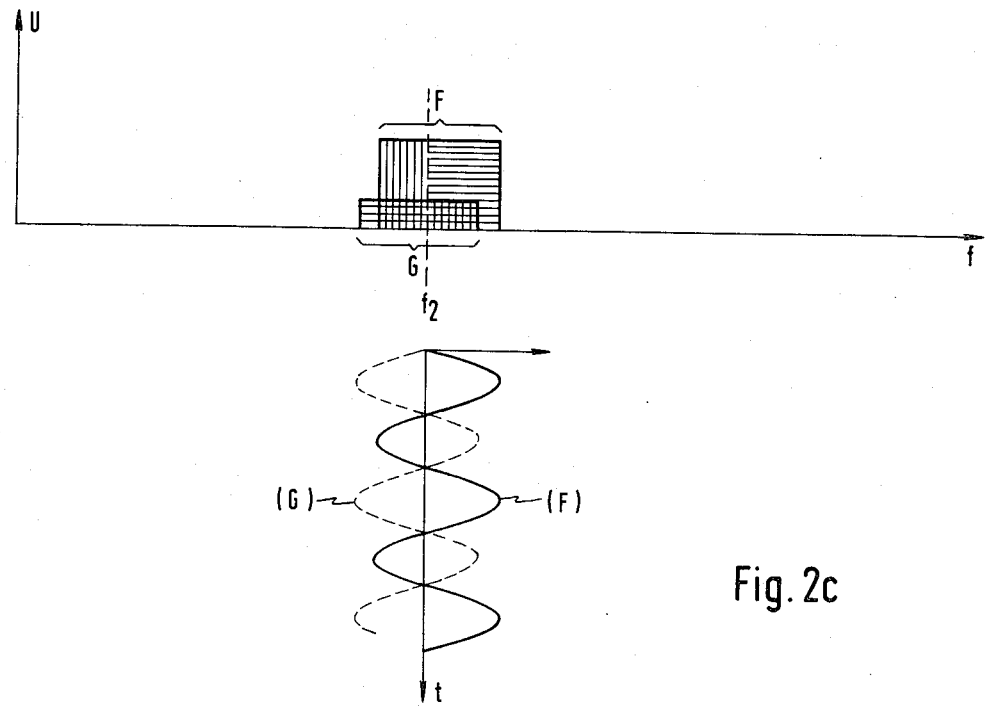

FIG. 2c shows the signal spectrum F and the inverted spectrum G following addition. It can be seen that the main amplitude corresponds to the amplitude of the transmitter signal A of FIG. 2a, and that only an interfering spectrum G of small amplitude is left as a result of incomplete subtraction. Below this spectral representation the time response of the frequency modulation of the signal spectrum is shown again. The broken line is the time response of the frequency modulation of the inverted signal G reduced in its voltage amplitude. The frequency deviation of this inverted signal is, of course, still equal to the frequency deviation of the actual signal F.

Figure 2D:
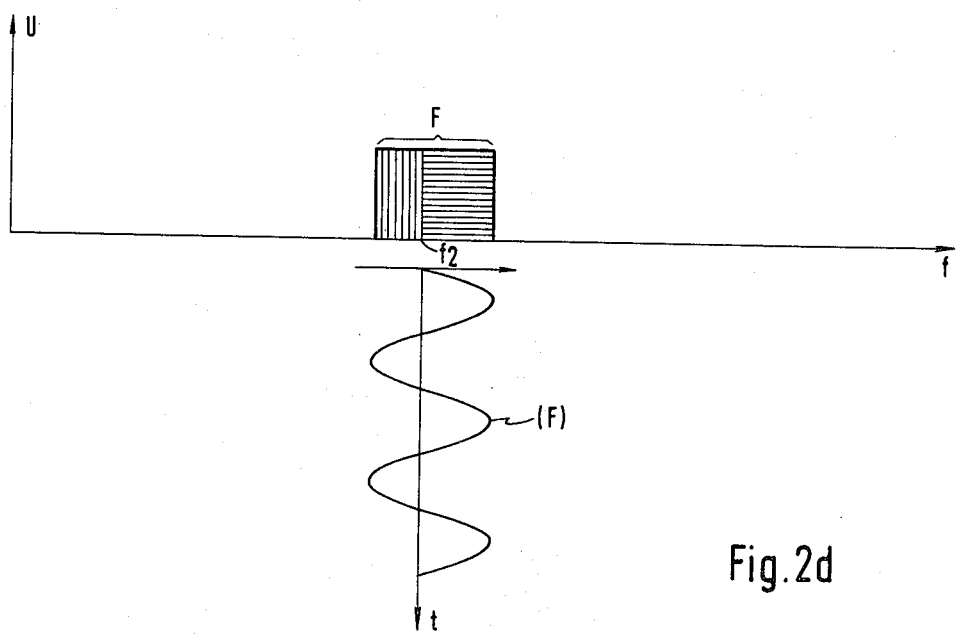

FIG. 2d shows the input signal for the FM discriminator 17 (FIG. 1), which signal has been freed from the inverted signal G by limitation. In this case, too, the time response of the signal F is shown.

For satellite television transmissions, the use of frequency modulation is intended for the video signal. The receiver according to the invention is especially suited for this application.

With a transmitter channel spacing of 30 MHz and a frequency deviation of ± 4 MHz as is planned for the time being, the filters 7 and 8 (FIGS. 1 and 3) can be very simple, i.e., one or two-stage RC networks. Intermediate amplifiers 9 and 10 are not necessary because the antenna signal has a sufficient amplitude over the entire frequency range of the receiver. Since all adjacent transmitter channels arrive with the same field strength and are frequency-modulated, the use of one or two-stage RC filters (7 and 8) is sufficient for adjacent-channel separation because, if these filters are used, the adjacent-channel transmitters are lowered by at least 18 dB, which, in the case of frequency-modulated signals, causes an adjacent-channel rejection of at least 50 to 60 dB after the limitation. The detuning between the frequency of the first oscillator 5 and the center frequency of the FM spectrum of the television signal, which detuning is expedient in case of sound reception, is rendered unnecessary because, in the absence of image modulation, the black level is located unsymmetrically about the center of the frequency spectrum. In addition, the eye is considerably more insensitive to interfering signals of small amplitude than the ear. Instead of the RC network 20 of FIG. 1 for generating the AFC voltage, a receiver for television signals uses a clamping circuit 26 shown in FIG. 3 to which clamping pulses 27 are applied in addition to the video signal. With this clamping circuit, clamping is effected to one of the reference potentials (sync level or black level). The AFC voltage obtained in this way can be applied directly to the automatic frequency control stage 23, which may be a varactor, for example. The low-frequency amplifier 18 of FIG. 1 is replaced by a video amplifier 24, and the loudspeaker 19 by a picture tube 25.

Figure 4A:
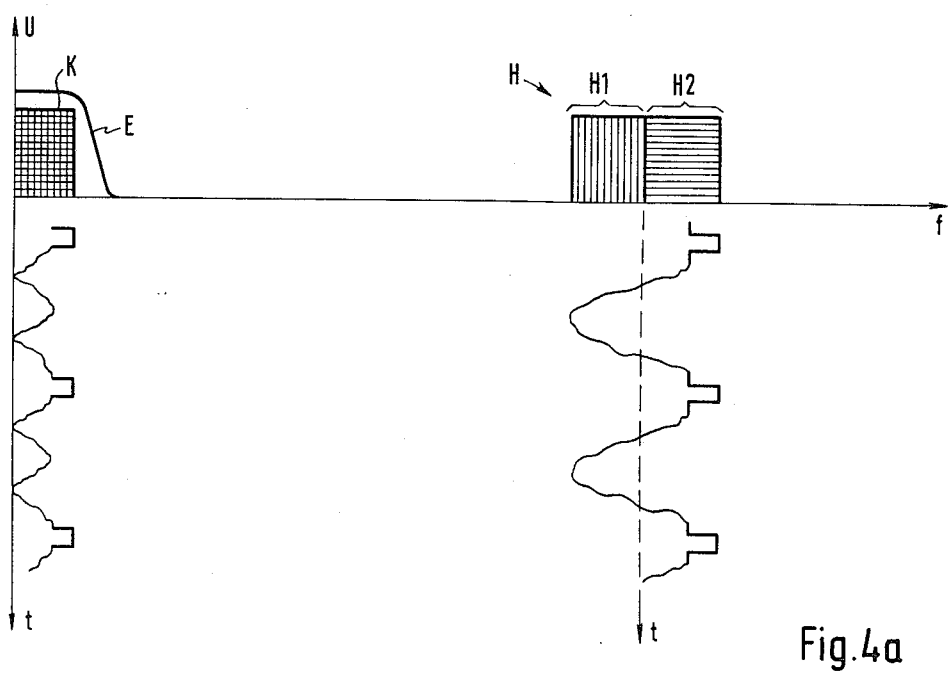
FIGS. 4a–b are explanatory diagrams.

FIG. 4 shows the corresponding spectral representations. The signal H of FIG. 4a corresponds to the signal A of FIG. 2a.

Figure 4B:
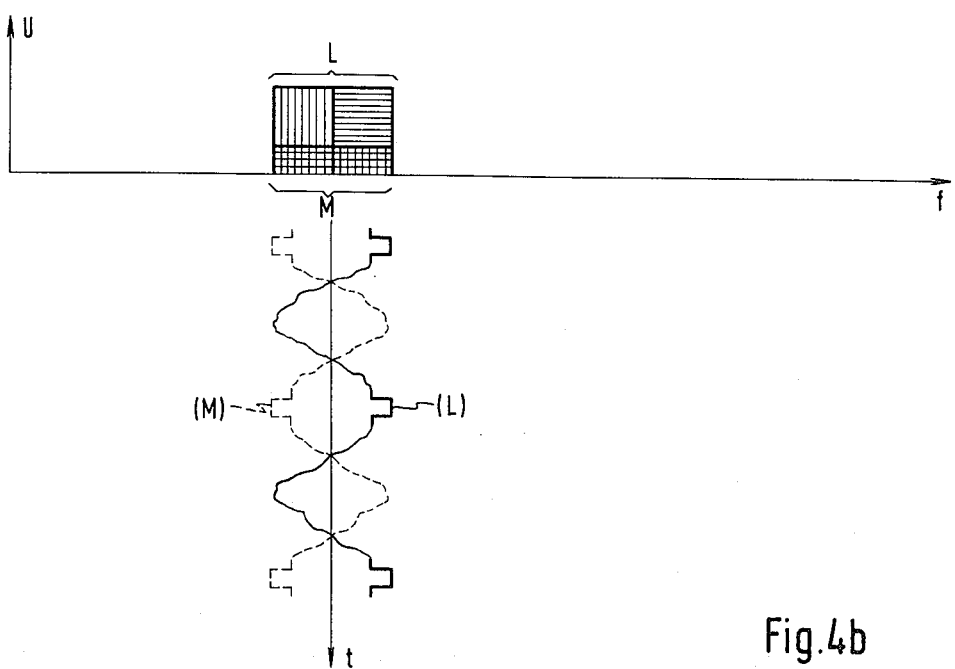

In this representation, the sideband spectra appearing in accordance with the Bessel functions and going beyond the frequency range of the spectrum H shown are not taken into account, either. H1 and H2 are approximately equal partial ranges of H. Shown below H is the time response of the frequency modulation, which corresponds to the time response of the video signal. On the left in FIG. 4a, K is the folded zero IF signal, below which the time response of the video signal reflected with respect to the zero axis is shown. E is the symbolically shown passband characteristic of the low-pass filters 7 and 8. FIG. 4b shows the signal converted to a higher frequency. L is the actual wanted signal, and M the inverse spectrum which results from asymmetries of the 90° filters and asymmetries during addition and whose amplitude is considerably smaller than the main spectrum L. This inverse spectrum M disappears virtually completely through the following limitation. Below this spectral representation there is again shown the associated time response of the frequency modulation of the signals L and M, which correspond to the video signal. As already stated, the signal indicated by the broken line (M) disappears completely through the limitation. Here, too, it is shown with equal amplitude, however, because the frequency deviation is equal in magnitude to the wanted signal although its voltage amplitude is considerably lowered.

Parts of the circuit which are not directly connected with the invention, such as deemphasis networks, delay equalizers, etc., are not shown in FIGS. 1 and 3. It should also be mentioned that the filters 7 and 8 have such a bandwidth that the sideband spectra necessary for satisfactory sound and image reproduction and exceeding the ranges A and H, respectively, are passed.

What is claimed is:

1. A receiver for frequency modulated RF signals having a known center frequency and bandwidth, comprising:
 a first and second signal mixing means each having first and second inputs and an output;
 means for receiving said frequency modulated RF signals and providing said signals to the first inputs of said first and second mixing means;
 first oscillator means having an output for providing a signal having a frequency approximately 10 kHz from the center frequency of the received signal, the output of said oscillator means being connected to the second inputs of each of said first and second mixing means;
 phase shifting means disposed at one of said inputs of the first mixing means for shifting the signal applied thereto by 90°;
 a pair of low pass filter means connected to the outputs of said first and second mixing means, said low pass filter means having a cut off frequency equal to approximately one-half the bandwidth of the received signals;
 third and fourth means for signal mixing and carrier suppression, each means having first and second inputs and an output, first inputs of said third and fourth means being connected to the pair of low pass filter means for receiving a filtered signal therefrom, said third mixing means receiving the signal from the first mixing means;

second oscillator means having an output providing a signal having a frequency equal to at least twice the cut off frequency of the low pass filter means, the output of said oscillator means being connected to the second inputs of each of said third and fourth mixing means;

phase shifting means disposed at the second input of the third mixing means for shifting the signal received thereby by 90°;

adding means having first and second inputs connected to the outputs of the second pair of mixing means for adding the signals received therefrom and for providing an output signal;

means for receiving the output signal from the adding means and for amplifying and limiting said signal and for providing a limited output signal; and demodulation means for receiving and demodulating the limited output signal for providing a demodulated audio signal.

2. A receiver for frequency modulated RF signals as described in claim 1, additionally comprising automatic frequency control means connected to the demodulation means and responsive to the audio signal therefrom for controlling the first oscillator means.

3. A receiver for frequency modulated Rf signals as described in claim 2, wherein said automatic frequency control has an unstable range within approximately ± 10 kHz of the center frequency of the received signal.

4. A receiver for frequency modulated RF signals as described in claim 1, wherein the modulation signal is a television signal having a reference level and the receiver additionally comprises automatic frequency control means adapted to receive the television signal and responsive thereto for controlling the frequency of the first oscillator means.

5. A receiver for frequency modulated RF signals as described in claim 1, wherein the demodulation means comprises a frequency discriminator and the receiver additionally comprises:

filter means for filtering the signal from the frequency discriminator to provide a control voltage;

amplifying and inverting means for amplifying and inverting said control voltage to provide a voltage having upper and lower limits corresponding to an oscillator deviation of ± 10 kHz from center frequency;

adding means for adding the control voltage and the amplified and inverted control voltage for providing a sum voltage; and automatic frequency control means responsive to the sum voltage for controlling the frequency of the first oscillator.

6. A receiver for frequency modulated RF signals as described in claim 1, additionally comprising non-limiting amplifiers disposed between the low pass filter means and the third and fourth means.

7. A broadcast receiver for FM signals, comprising:

a converter for developing a low IF signal, said converter comprising two parallel paths each path having two balanced modulators interconnected by a low pass filter having a cut off frequency equal to approximately one-half the FM signal bandwidth;

first oscillator means having an output for providing a signal having a frequency approximately 10 kHz from the center frequency of the received FM signals said output being connected to the first modulator of each path;

means disposed between the first oscillator and the first modulator of one of said paths for shifting the oscillator signal by 90°;

second oscillator means having an output for providing a signal having a frequency approximately equal to at least twice the cut off frequency of the low pass filter means the output of said oscillator being connected to the second modulator of each path;

phase shifting means disposed between said oscillator and the second modulator of said one path for shifting the oscillator signal by 90°;

means for adding the outputs of each path;

means for receiving the added signals and for amplifying and limiting said signals and providing a limited output signal; and means for receiving and demodulating the limited output signal for providing an audio signal.

* * * * *